United States Patent
Maeda et al.

(10) Patent No.: US 10,520,761 B2
(45) Date of Patent: Dec. 31, 2019

(54) METHOD OF PRODUCING SUBSTRATE HAVING ALIGNMENT MARK

(71) Applicant: Sharp Kabushiki Kaisha, Sakai, Osaka (JP)

(72) Inventors: Masaki Maeda, Sakai (JP); Yoshihito Hara, Sakai (JP); Tohru Daitoh, Sakai (JP); Hajime Imai, Sakai (JP); Hideki Kitagawa, Sakai (JP); Toshikatsu Itoh, Sakai (JP); Tatsuya Kawasaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/055,205

(22) Filed: Aug. 6, 2018

(65) Prior Publication Data
US 2019/0072790 A1    Mar. 7, 2019

(30) Foreign Application Priority Data

Sep. 5, 2017   (JP) ................. 2017-170136

(51) Int. Cl.
| | | |
|---|---|---|
| G02F 1/1333 | (2006.01) | |
| G02F 1/1362 | (2006.01) | |
| H01L 23/544 | (2006.01) | |
| H01L 21/3213 | (2006.01) | |

(52) U.S. Cl.
CPC ...... *G02F 1/1333* (2013.01); *G02F 1/136227* (2013.01); *H01L 21/32139* (2013.01); *H01L 23/544* (2013.01); *G02F 2001/133354* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 5,933,744 A * | 8/1999 | Chen | ...................... H01L 23/544 257/E21.244 |
| 9,633,925 B1 | 4/2017 | Sakuma et al. | |
| 2005/0070068 A1* | 3/2005 | Kobayashi | ............ G03F 9/7076 438/401 |
| 2006/0125101 A1* | 6/2006 | Kirikoshi | .............. H01L 23/522 257/758 |
| 2011/0018118 A1 | 1/2011 | Hsieh et al. | |
| 2015/0249054 A1 | 9/2015 | Tian et al. | |

FOREIGN PATENT DOCUMENTS

JP       2004-317728 A    11/2004

\* cited by examiner

*Primary Examiner* — Angel Roman
(74) *Attorney, Agent, or Firm* — Keating & Bennett, LLP

(57) ABSTRACT

A method of producing a substrate having an alignment mark includes a process of forming a lower layer side metal film on a substrate and forming a lower layer side alignment mark base having a lower layer side alignment mark that is a hole, a process of forming an upper layer side metal film on the substrate and the lower layer side metal film, a process of forming a photoresist film on the upper layer side metal film and forming a lower layer side alignment mark overlapping portion overlapping a part of the lower layer side alignment mark with patterning, an etching process of removing with etching selectively portions of the lower and upper layer side metal films not overlapping the lower layer side alignment mark overlapping portion and forming an upper layer side alignment mark that is the upper layer side metal film, and a photoresist removing process.

4 Claims, 11 Drawing Sheets

//\# METHOD OF PRODUCING SUBSTRATE HAVING ALIGNMENT MARK

CROSS REFERENCE TO RELATED APPLICATION

This application claims priority from Japanese Patent Application No. 2017-170136 filed on Sep. 5, 2017. The entire contents of the priority application are incorporated herein by reference.

TECHNICAL FIELD

The present invention relates to a method of producing a substrate having an alignment mark.

BACKGROUND

A substrate having an alignment mark that is included in a display device has been known as is described in Japanese Unexamined Patent Application Publication No. 2004-317728. Such a substrate with an alignment mark is provided with a plurality of filming layers where filming patterns are formed respectively, inter-layer films formed between the plurality of filming layers, an alignment mark formed of the same material with the filming patterns on at least one of the plurality of filming layers, and an opening part which is formed in the inter-layer film on the alignment mark to expose the alignment mark.

SUMMARY

According to the substrate with an alignment mark, the alignment mark is exposed through the opening part formed in the inter-layer film such that the films are focused exactly regardless of a film thickness of the inter-layer film and alignment accuracy can be improved. However, in a configuration including multiple alignment marks, arrangement spaces for the alignment marks are necessary and this may increase the arrangement spaces. If the alignment marks are disposed in different positions, the alignment accuracy may be lowered.

The technology disclosed herein was made in view of the above circumstances. An object is to reduce an arrangement space for an alignment mark and improve alignment accuracy.

A method of producing a substrate having an alignment mark according to one technology includes a lower layer side metal film forming process of forming a lower layer side metal film on a substrate and forming a lower layer side alignment mark base having a lower layer side alignment mark that is a hole, an upper layer side metal film forming process of forming an upper layer side metal film on the substrate and the lower layer side metal film, a photoresist film forming process of forming a photoresist film with patterning on the upper layer side metal film and forming a lower layer side alignment mark overlapping portion that overlaps at least a part of the lower layer side alignment mark, an etching process of removing with etching selectively portions of the lower layer side metal film and the upper layer side metal film not overlapping the lower layer side alignment mark overlapping portion and forming an upper layer side alignment mark that is formed from the upper layer side metal film, and a photoresist removing process of removing the photoresist film.

In the lower layer side metal film forming process, the lower layer side metal film is formed on the substrate and subjected to pattering. Then, the lower layer side alignment mark base having the lower layer side alignment mark, which is a hole, is formed. After the upper layer side metal film is formed on the substrate and the lower layer side metal film in the upper layer side metal film forming process, the photoresist film is formed on the upper layer side metal film and subjected to patterning in the photoresist film forming process. Then, the lower layer side alignment mark overlapping portion that overlaps at least apart of the lower layer side alignment mark and is formed from the photoresist film is formed. In the photoresist film forming process, the photoresist film is subjected to patterning after the alignment adjustment of the substrate is performed with using the lower layer side alignment mark of the lower layer side alignment mark base. Therefore, the lower layer side alignment mark overlapping portion can be formed with high accuracy.

In the etching process, the portions of the lower layer side metal film and the upper layer side metal film that do not overlap the lower layer side alignment mark overlapping portion, which is the photoresist film, are selectively removed with etching. The lower layer side alignment mark base, which is the lower layer side metal film, dose not overlap the lower layer side alignment mark overlapping portion that is the photoresist film and overlaps at least a part of the lower layer side alignment mark. Therefore, the lower layer side alignment mark base is removed according to the etching treatment. The portion of the upper layer side metal film overlapping the lower layer side alignment mark overlapping portion, which is the photoresist film, is not removed with etching and remains as the upper layer side alignment mark. The upper layer side alignment mark overlaps at least a part of the lower layer side alignment mark and therefore, the upper layer side alignment mark is arranged in the arrangement space for the lower layer side alignment mark. Therefore, compared to a configuration that the lower layer side alignment mark and the upper layer side alignment mark are arranged in separate positions, the arrangement space for each of the alignment marks can be smaller and alignment accuracy can be improved. Thereafter, in the photoresist film removing process, the photoresist film is removed. Accordingly, the alignment adjustment of the substrate can be performed with using the upper layer side alignment mark.

A method of producing a substrate having an alignment mark according to another technology includes a lower layer side metal film forming process of forming a lower layer side metal film on a substrate and forming a lower layer side alignment mark, an upper layer side metal film forming process of forming an upper layer side metal film on the substrate and the lower layer side metal film, a photoresist film forming process of forming a photoresist film on the upper layer side metal film and forming a lower layer side alignment mark non-overlapping portion with patterning, the lower layer side alignment mark non-overlapping portion not overlapping the lower layer side alignment mark and having a lower layer side alignment mark overlapping hole overlapping the lower layer side alignment mark, an etching process of removing with etching selectively portions of the lower layer side metal film and the upper layer side metal film not overlapping the lower layer side alignment mark non-overlapping portion that is the photoresist film, and forming an upper layer side alignment mark base that is formed from the upper layer side metal film, the upper layer side alignment mark base including an upper layer side alignment mark that is a hole overlapping the lower layer side alignment mark overlapping hole, and a photoresist removing process of removing the photoresist film.

In the lower layer side metal film forming process, the lower layer side metal film is formed on the substrate and subjected to pattering. Then, the lower layer side alignment mark is formed. After the upper layer side metal film is formed on the substrate and the lower layer side metal film in the upper layer side metal film forming process, the photoresist film is formed on the upper layer side metal film and subjected to patterning in the photoresist film forming process. Then, the lower layer side alignment mark non-overlapping portion that is formed from the photoresist film and includes the lower layer side alignment mark overlapping hole overlapping the lower layer side alignment mark and does not overlap the lower layer side alignment mark is formed. In the photoresist film forming process, the photoresist film is subjected to patterning after the alignment adjustment of the substrate is performed with using the lower layer side alignment mark. Therefore, the lower layer side alignment mark non-overlapping portion can be formed with high accuracy.

In the etching process, the portions of the lower layer side metal film and the upper layer side metal film that do not overlap the lower layer side alignment mark non-overlapping portion, which is the photoresist film, are selectively removed with etching. The lower layer side alignment mark, which is the lower layer side metal film, dose not overlap the lower layer side alignment mark non-overlapping portion that is the photoresist film and has the lower layer side alignment mark overlapping hole overlapping the lower layer side alignment mark. Therefore, the lower layer side alignment mark is removed according to the etching treatment. The portion of the upper layer side metal film overlapping the lower layer side alignment mark non-overlapping portion, which is the photoresist film, is not removed with etching and remains as the upper layer side alignment mark base. The upper layer side alignment mark base has the upper layer side alignment mark that is a hole overlapping the lower layer side alignment mark overlapping hole. The upper layer side alignment mark overlaps the lower layer side alignment mark and therefore, the upper layer side alignment mark is arranged in the arrangement space for the lower layer side alignment mark. Therefore, compared to a configuration that the lower layer side alignment mark and the upper layer side alignment mark are arranged in separate positions, the arrangement space for each of the alignment marks can be smaller and alignment accuracy can be improved. Thereafter, in the photoresist film removing process, the photoresist film is removed. Accordingly, the alignment adjustment of the substrate can be performed with using the upper layer side alignment mark.

According to the present technology, an arrangement space for an alignment mark is reduced and alignment accuracy is improved.

DETAILED DESCRIPTION

First Embodiment

Figure 1:
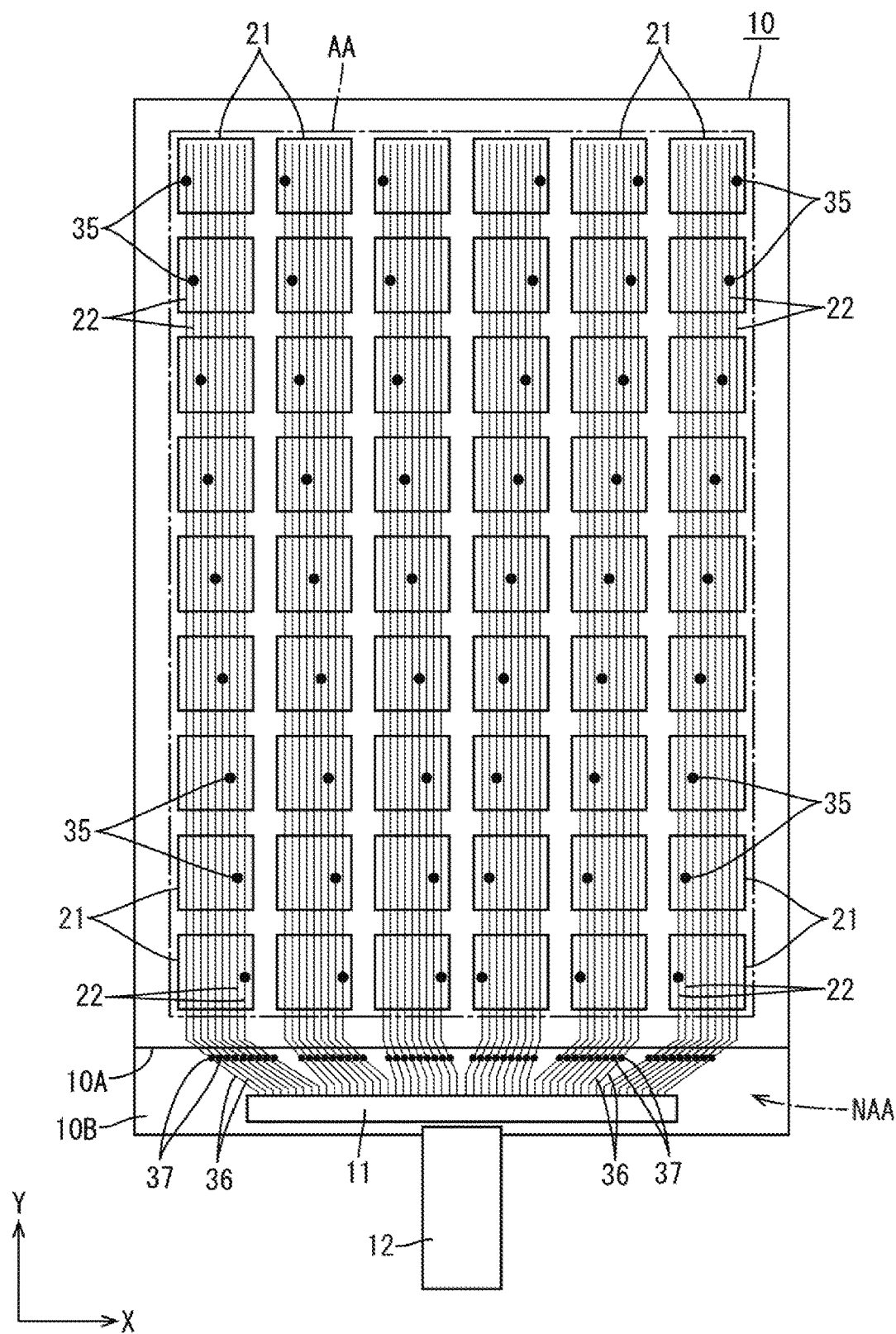
FIG. 1 is a plan view illustrating a plan view arrangement of touch electrodes and touch lines of a liquid crystal panel according to a first embodiment.

A first embodiment will be described with reference to FIGS. 1 to 12. In the embodiment section, an array substrate (a substrate having an alignment mark) 10B included in a liquid crystal panel (a display panel, a display panel having a position input function) 10 will be described. The liquid crystal panel 10 has a touch panel function (a position input function) in addition to a display function. X-axis, Y-axis and Z-axis may be indicated in some of the drawings. The axes in each drawing correspond to the respective axes in other drawings. A vertical direction in FIGS. 3, 7, and 9 to 12 is a reference vertical direction and an upper side and a lower side in the drawings are a front side and a rear side, respectively.

The liquid crystal panel 10 displays images thereon while using illumination light from a backlight device (a lighting device). As illustrated in FIG. 1, on the liquid crystal panel 10, a driver (a panel driving section, a drive circuit section) 11 that drives the liquid crystal panel 10, and a flexible printed circuit board (an external connection component) 12 that electrically connects the liquid crystal panel 10 and a control circuit board (not illustrated) are mounted. The liquid crystal panel 10 has a rectangular and vertically long overall (rectangular) shape. The liquid crystal panel 10 includes a display area (an active area) AA in a middle area of a plate surface thereof and a non-display area (a non-active area) NAA on an outer peripheral side of the display area AA so as to surround the display area AA. Images appear on the display area AA. The non-display area NAA has a plan-view frame shape. A short-side direction of the liquid crystal panel 10 corresponds with the X-axis direction in each drawing and a long-side direction corresponds with the Y-axis direction. Furthermore, a plate thickness direction corresponds with the Z-axis direction. In FIG. 1, an alternate long and short dashed line represents an outer shape of the display area AA and an area outside the alternate long and short dashed line is a non-display area NAA. The liquid crystal panel 10 at least includes a pair of substrates 10A, 10B and a liquid crystal layer 10C between the substrates 10A and 10B (refer FIG. 3). The liquid crystal layer 10C includes liquid crystal molecules having optical characteristics that vary according to application of electric field. The liquid crystal layer 10C is surrounded by and sealed with a sealing member that is between the substrates 10A and 10B. One of the substrates 10A, 10B on the front (a front-surface side) is a CF substrate (a counter substrate) 10A and the other one of the substrates 10A, 10B on the rear (a rear-surface side) is an array substrate (a substrate having an alignment mark, a thin film transistor substrate) 10B. Each of the CF substrate 10A and the array substrate 10B includes a glass substrate 10GS and various kinds of films layered on an inner surface thereof (refer FIG. 5). Polarizing plates, which are not illustrated, are bonded to outer surfaces of the substrates 10A, 10B, respectively.

Figure 2:
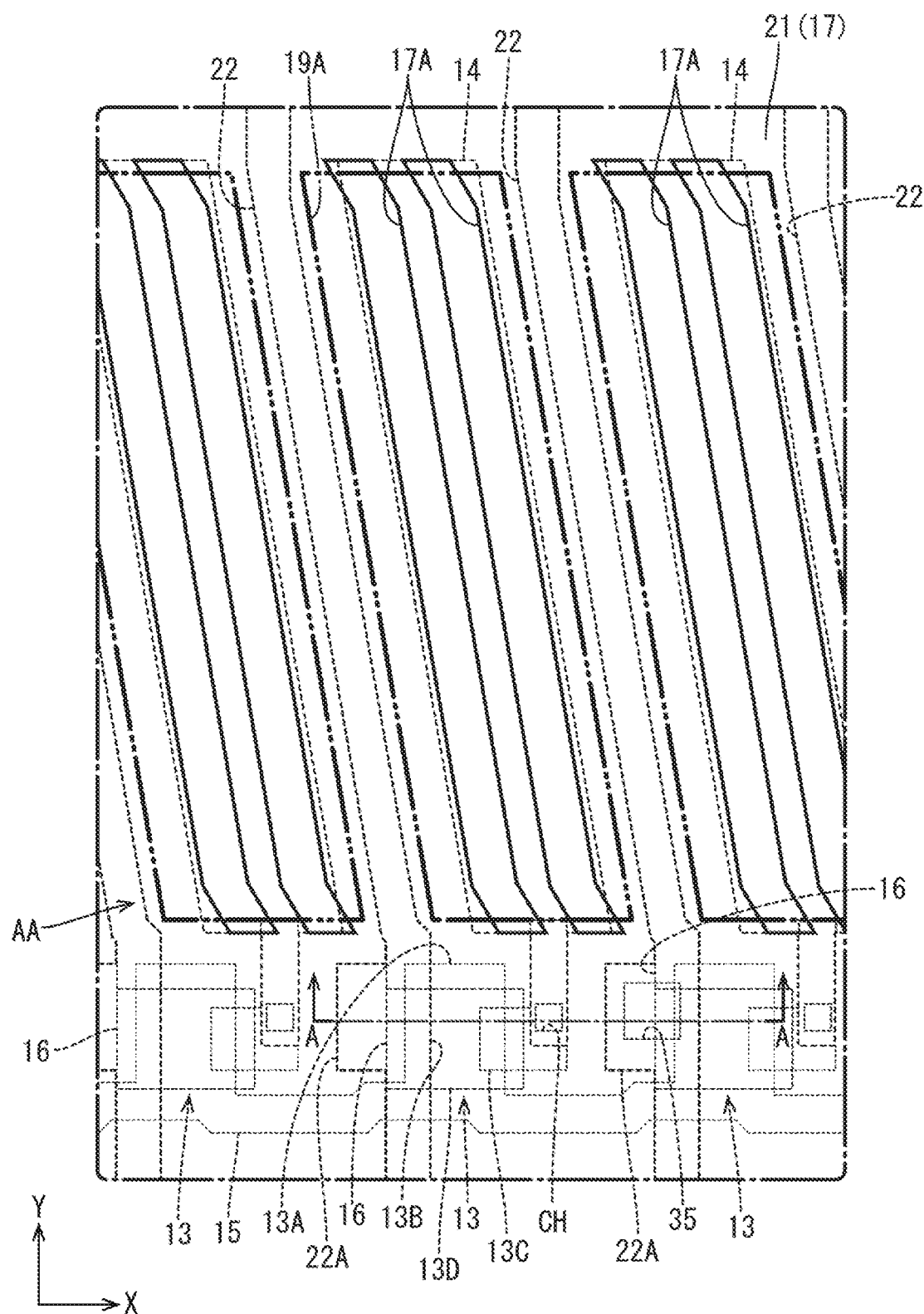
FIG. 2 is a plan view illustrating arrangement of pixels of an array substrate included in a liquid crystal panel.

As illustrated in FIG. 2, a large number of thin film transistors (TFTs, display elements) 13 and a large number of pixel electrodes 14 are arranged in a matrix on the inner surface of the array substrate 10B (a surface facing the liquid crystal layer 10C and a surface opposite the CF substrate 10A) in the display area AA. The TFTs 13 and the pixel electrodes 14 are arranged in the X-axis direction and the Y-axis direction. Gate lines (scan lines) 15 and source lines (signal lines, data lines) 16 are arranged in a matrix around the TFTs 13 and the pixel electrodes 14. The gate lines 15 extend substantially straight along the X-axis direction and the source lines 16 extend substantially along the Y-axis direction. The pixel electrode 14 has a substantially parallelogram plan view shape that is vertically elongated. The source line 16 is present between the pixel electrodes 14 that are adjacent to each other with respect to a short-side direction (the X-axis direction) and the gate line 15 is present between the pixel electrodes 14 that are adjacent to each other with respect to a long-side direction (Y-axis direction).

Figure 3:
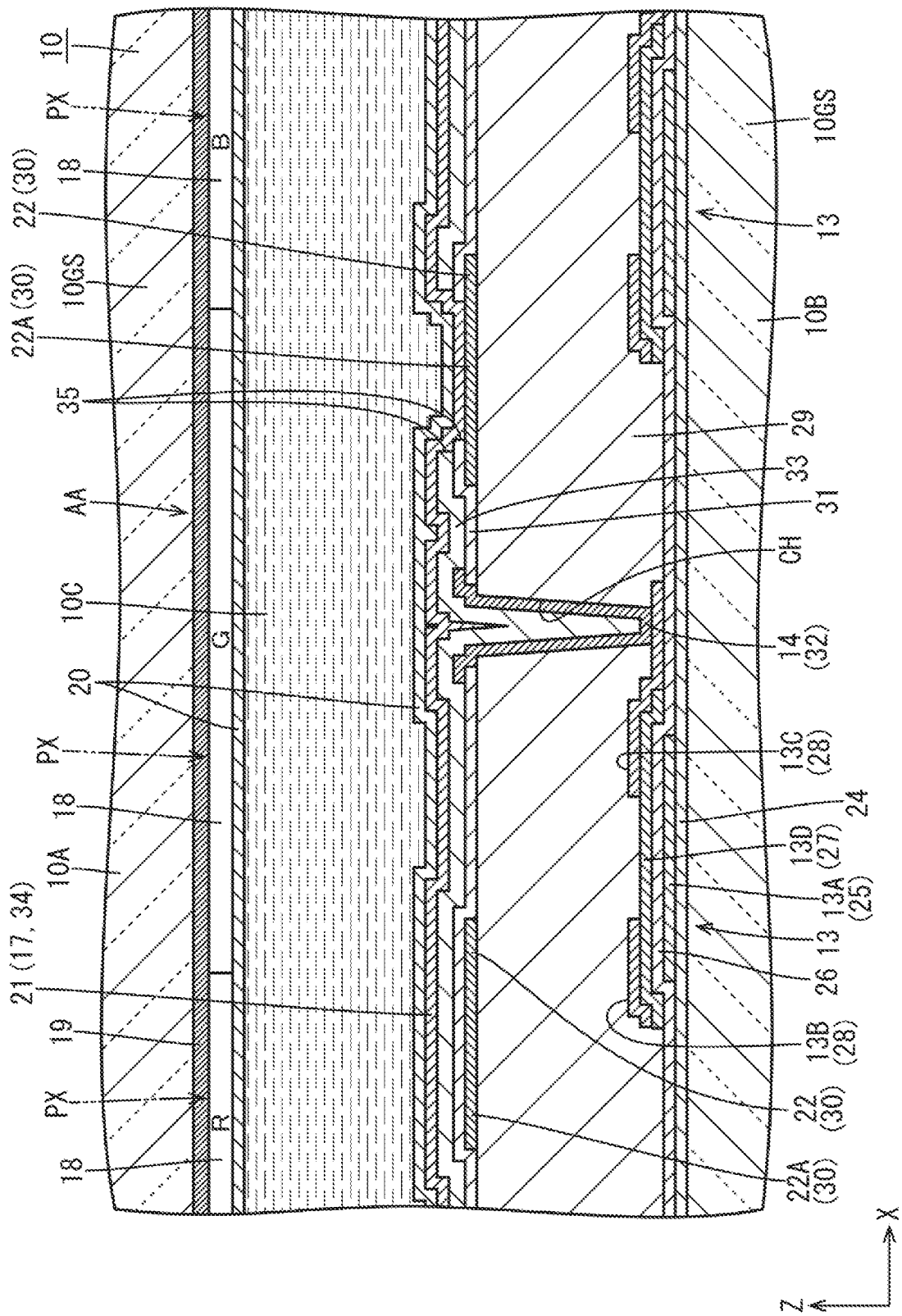
FIG. 3 is a cross-sectional view taken along line A-A in FIG. 2.

As illustrated in FIGS. 2 and 3, the TFT 13 includes a gate electrode 13A, a source electrode 13B, a drain electrode 13C, and a channel section 13D. The gate electrode 13A is formed by projecting a part of the gate line 15 toward the pixel electrode 14 that is to be connected to. The source electrode 13B is formed from a part of the source line 16 overlapping the gate electrode 13A. The drain electrode 13C is disposed away from the source electrode 13B. The channel section 13D is connected to the source electrode 13B and the drain electrode 13C. The drain electrode 13C is connected to the pixel electrode 14 through a pixel contact hole CH that is formed in a flattening film 29 and a second interlayer insulation film 31, which will be described later. If the TFT 13 is activated by the scan signal supplied from the gate line 15 to the gate electrode 13A, the potential of the image signal supplied to the source line 16 is supplied from the source electrode 13B to the drain electrode 13C through the channel section 13D. Accordingly, the pixel electrode 14 is charged with power.

As illustrated in FIGS. 2 and 3, a common electrode 17 is disposed on an inner surface of the array substrate 10B in the display area AA so as to overlap all of the pixel electrodes 14. The common electrode 17 is included in an upper layer than the pixel electrodes 14 (closer to the liquid crystal layer 10C). The common electrode 17 is always provided with a constant reference potential and extends over a substantially entire area of the display area AA. The common electrode 17 has pixel overlapping holes (pixel overlapping slits, alignment control slits) 17A (two pixel overlapping holes 17A in FIG. 2) at portions overlapping the respective pixel electrodes 14. The pixel overlapping hole 17A has a vertically elongated shape. According to charging of the pixel electrode 14, potential difference appears between the pixel electrode 14 and the common electrode 17 that are overlapped with each other. If such potential difference appears, a fringe field (an oblique field) including a component in a direction normal to a plate surface of the array substrate 10B is applied to a section between a hole edge of the pixel overlapping hole 17A and the pixel electrode 14. Therefore, the alignment state of the liquid crystal molecules included in the liquid crystal layer 10C can be controlled with using the fringe filed. Namely, the liquid crystal panel 10 of this embodiment is driven in the fringe filed switching (FFS) mode.

As illustrated in FIG. 3, the CF substrate 10A includes color filters 18 of three colors of red (R), green (G), and blue (B) on an inner surface thereof and in the display area AA. The color filters 18 exhibiting different colors are arranged along the gate line 15 (the X-axis direction) repeatedly and extend along the source line 16 (almost Y-axis direction). Accordingly, the color filters 18 are arranged in stripes as a whole. The color filters 18 overlap the pixel electrodes 14 in a plan view. In the liquid crystal panel 10, the color filters 18 of R, G, and B and three pixel electrodes 14 opposite the respective color filters 18 configure pixel sections PX of three colors, respectively. In the liquid crystal panel 10, the pixel sections PX of three colors of R, G, and B that are arranged adjacent to each other in the X-axis direction configure display pixels that provides color display with predetermined gradation. The pixel sections PX are arranged in the X-axis direction at an interval of about several tens of µm. A light blocking section (a pixel in-between light blocking section, a black matrix) 19 is formed on an inner surface of the CF substrate 10A in the display area AA. The light blocking section 19 blocks light. The light blocking section 19 has substantially a matrix shape in a plan view to separate the adjacent pixel sections PX (the pixel electrodes 14). The light blocking section 19 has pixel holes 19A above the pixel electrodes 14 on the array substrate 10B in a plan view. Most part of the pixel electrode 14 is exposed through the pixel hole 19A. The light blocking section 19 prevents the light from crossing the adjacent pixel sections PX and ensures independent gradation of each pixel section PX. The light blocking section 19 overlaps the gate lines 15 and the source lines 16 on the array substrate 10B side in a plan view. Alignment films 20 for aligning the liquid crystal molecules included in the liquid crystal layer 10C are disposed on most inner surfaces of the substrates 10A, 10B that are in contact with the liquid crystal layer 10C. On the CF substrate 10A side, an overcoat film may be included between the alignment film 20 and the color filters 18.

The various kinds of films formed in layers on the inner surface side of the array substrate 10B will be described. As illustrated in FIG. 3, on a glass substrate 10GS of the array substrate 10B, a first metal film (a lower metal film) 23, a first interlayer insulation film 24, a second metal film (an upper metal film, a gate metal film) 25, a gate insulation film 26, a semiconductor film 27, a third metal film (a source metal film) 28, a flattening film (an organic insulation film) 29, a fourth metal film 30, a second interlayer insulation film 31, a first transparent electrode film 32, a third interlayer insulation film 33, a second transparent electrode film 34, and the alignment film 20 are formed in layers.

Each of the first metal film 23, the second metal film 25, the third metal film 28, and the fourth metal film 30 is a layered metal film of copper, titanium, or aluminum, or a multilayered film of different kinds of metal material, or an alloy. According to such a configuration, the metal films have conductivity and light blocking properties. The first metal film 23 forms touch line lead-out wires 36, which will be described later. The second metal film 25 forms the gate lines 15 and the gate electrodes 13A of the TFTs 13. The third metal film 28 forms the source lines 16, the source electrodes 13B and the drain electrodes 13C of the TFTs 13, and the touch line lead-out wires 36, which will be described later. The fourth metal film 30 forms touch lines 22, which will be described later. The first interlayer insulation film 24, the gate insulation film 26, the second interlayer insulation film 31, and the third interlayer insulation film 33 are made of inorganic material such as silicon nitride (SiNx) and silicon oxide ($SiO_2$). The metal films 25, 28, 30 on the upper layer side and the transparent electrode films 32, 34 are insulated from the metal films 23, 25, 28, 30 on the lower layer side and the first transparent electrode film 32 by the insulation films 24, 26, 31, and 33. Each of the insulation films 24, 26, 31, 33 that are made of inorganic material extends in an area ranging from the display area AA to the non-display area NAA. Each of the insulation films 24, 26, 31, 33 is thinner than the flattening film 29, which will be described later. The flattening film 29 is made of organic material such as acrylic resin (e.g., polymethyl methacrylate (PMMA)) and has a function of flattening a surface having steps formed in a lower layer side than the flattening film 29. The flattening film 29 is thicker than each of the insulation films 24, 26, 31, 33 made of inorganic material. The semiconductor film 27 is formed in a thin film of oxide semiconductor and forms the channel section (a semiconductor section) 13D included in the TFT 13 and connected to the source electrode 13B and the drain electrode 13C. The first transparent electrode film 32 and the second transparent electrode film 34 are made of transparent electrode material such as indium tin oxide (ITO). The first transparent electrode film 32 forms the pixel electrodes 14 and the second transparent electrode film 34 forms a common electrode (a touch electrode 21, which will be described later).

The liquid crystal panel 10 according to this embodiment has a displaying function of displaying images and a touch panel function (a position inputting function) of detecting positions input by a user (input positions) based on the displayed images. The liquid crystal panel 10 includes an in-cell touch panel pattern for the position inputting function. The touch panel pattern is a so-called projected capacitive touch panel pattern and a detection method of a self-capacitance type is used. The touch panel pattern is disposed on the array substrate 10B side out of a pair of substrates 10A, 10B. As illustrated in FIG. 1, the touch panel pattern includes touch electrodes (position detection electrodes) 21 that are arranged in a matrix within a plate surface of the array substrate 10B. The touch electrodes 21 are arranged in the display area AA of the array substrate 10B. Therefore, the display area AA of the liquid crystal panel 10 substantially matches a touch area (a position input area) where input positions can be detected, and the non-display area NAA substantially matches a non-touch area (non-position input area) where input positions cannot be detected. If a finger (a position inputter, not illustrated), which is a conductive member, approaches a surface (a display surface) of the liquid crystal panel 10 for inputting a position according to an image on the display area AA of the liquid crystal panel 10 that is seen by a user, electrostatic capacitance is generated between the finger and the touch electrode 21. Accordingly, change in electrostatic capacitance is caused at the touch electrode 21 near the finger and the electrostatic capacitance detected at the touch electrode 21 near the finger differs from that detected at the touch electrode 21 far from the finger. Based on such difference, the input position can be detected.

As illustrated in FIG. 1, the touch electrodes 21 are formed from the common electrode 17 disposed on the array substrate 10B. The common electrode 17 is defined in a grid and divided into squares in a plan view and formed into the touch electrodes 21 each of which is electrically independent. The touch electrodes 21 formed by dividing the common electrode 17 are arranged in the X-axis direction and the Y-axis direction in the display area AA and arranged in a matrix. The touch electrode 21 is formed in a plan view square shape and one-side dimension thereof is several mm (for example, about 2 mm to 5 mm). Therefore, the touch electrode 21 is quite larger in a plan-view size than the pixel section PX (the pixel electrode 14) and the touch electrode 21 has a size ranging over multiple pixel sections PX (several tens of or several hundreds of pixel sections PX) in the X-axis direction and the Y-axis direction. Multiple touch lines (position detection lines) 22 disposed on the array substrate 10B are selectively connected to the multiple touch electrodes 21. The touch lines 22 extend substantially along the Y-axis direction and parallel to the source lines 16 on the array substrate 10B. The touch line 22 is connected selectively to specific one of the touch electrodes 21 that are arranged in the Y-axis direction. Furthermore, the touch lines 22 are connected to a detection circuit, which is not illustrated. The detection circuit may be included in the driver 11 but may be provided outside the liquid crystal panel via the flexible printed circuit 12. The reference potential signals related to the display function and the touch signals related to the touching function (the position detection signals) are supplied to the touch electrodes 21 at different timing through the touch lines 22. The reference potential signals are transferred to all of the touch lines 22 at the same timing and all of the touch electrodes 21 have the reference potential and function as the common electrode 17. The arrangement of the touch electrodes 21 are schematically illustrated in FIG. 1 and the number of the touch electrodes 21 or the specific arrangement thereof may be appropriately altered.

The touch lines 22 will be described in detail. As illustrated in FIGS. 2 and 3, the touch line 22 formed from the fourth metal film 30 is connected to the touch electrode 21 that is to be connected to and formed from the second transparent electrode film 34 through touch electrode contact holes 35 formed in the second interlayer insulation film 31 and the third interlayer insulation film 33. The touch line 22 has a wide section 22A that is next to the TFT 13 (the drain electrode 13C) with respect to the X-axis direction and the wide section 22A functions as a connection pad that is to be connected to the touch electrode 21. The touch line 22 extends while crossing the TFTs 13 arranged in the Y-axis direction and has the wide sections 22A at portions next to the respective TFTs 13. The touch electrode contact hole 35 is selectively disposed on a part (one or a plurality) of the wide sections 22A. The parasitic capacitance that may be generated between the touch line 22 and each TFT 13 or each pixel electrode 14 can be equalized because the wide section 22A is formed for every TFT 13 (every pixel electrode 14). The touch line 22 extends along the Y-axis direction while crossing all the touch electrodes 21 and is selectively connected to specific touch electrode 21 by changing the planar arrangement of the touch electrode contact hole 35 (see FIG. 1). The touch line 22 overlaps the source line 16 in a plan view.

Figure 4:
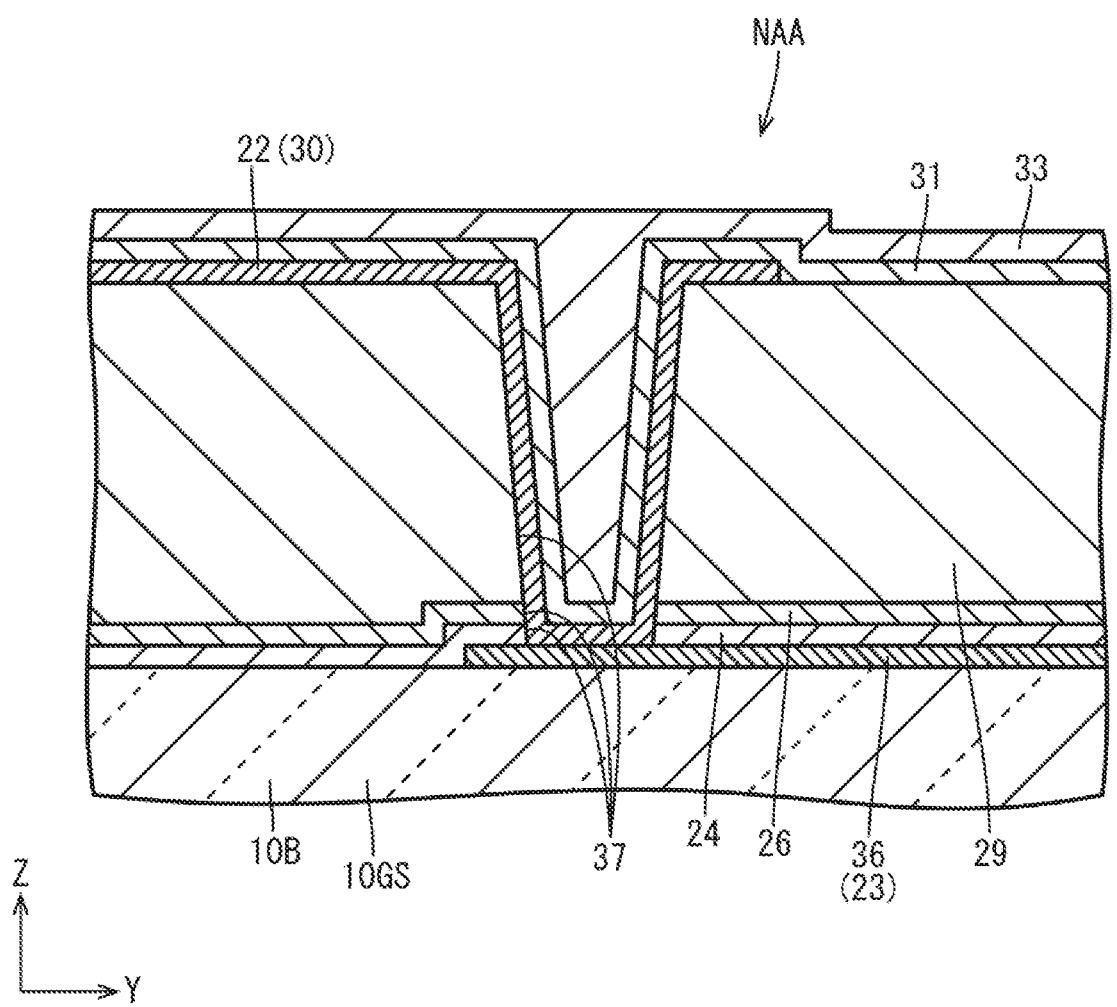
FIG. 4 is a cross-sectional view illustrating a connection part of a touch line and a touch line lead-out wire on the array substrate.

As illustrated in FIG. 1, the touch lines 22 extend in a substantially fan shape in the non-display area NAA of the array substrate 10B and extended ends thereof are connected to the touch line lead-out wires 36. The touch line lead-out wires 36 extend in a fan shape along the touch lines 22 and one ends thereof are connected to the touch lines 22 and another ends thereof are connected to the driver 11. As illustrated in FIG. 4, the touch line lead-out wires 36 are formed from the first metal film 23 and one ends of the touch line lead-out wires 36 overlap the extended ends of the touch lines 22 that are formed from the fourth metal film 30. The overlapping portions are connected to each other through a lead-out wire contact hole 37 formed in the first interlayer insulation film 24, the gate insulation film 26, and the flattening film 29 that are present between the overlapping portions. Another ends of the touch line lead-out wires 36 are provided with terminals (not illustrated) that are connected to the driver 11. The source lines 16 are connected to the driver 11 via source line lead-out wires similarly to the touch lines 22. The source line lead-out wires are formed from the second metal film 25, for example (a metal film different from that of the touch line lead-out wires 36).

Figure 5:
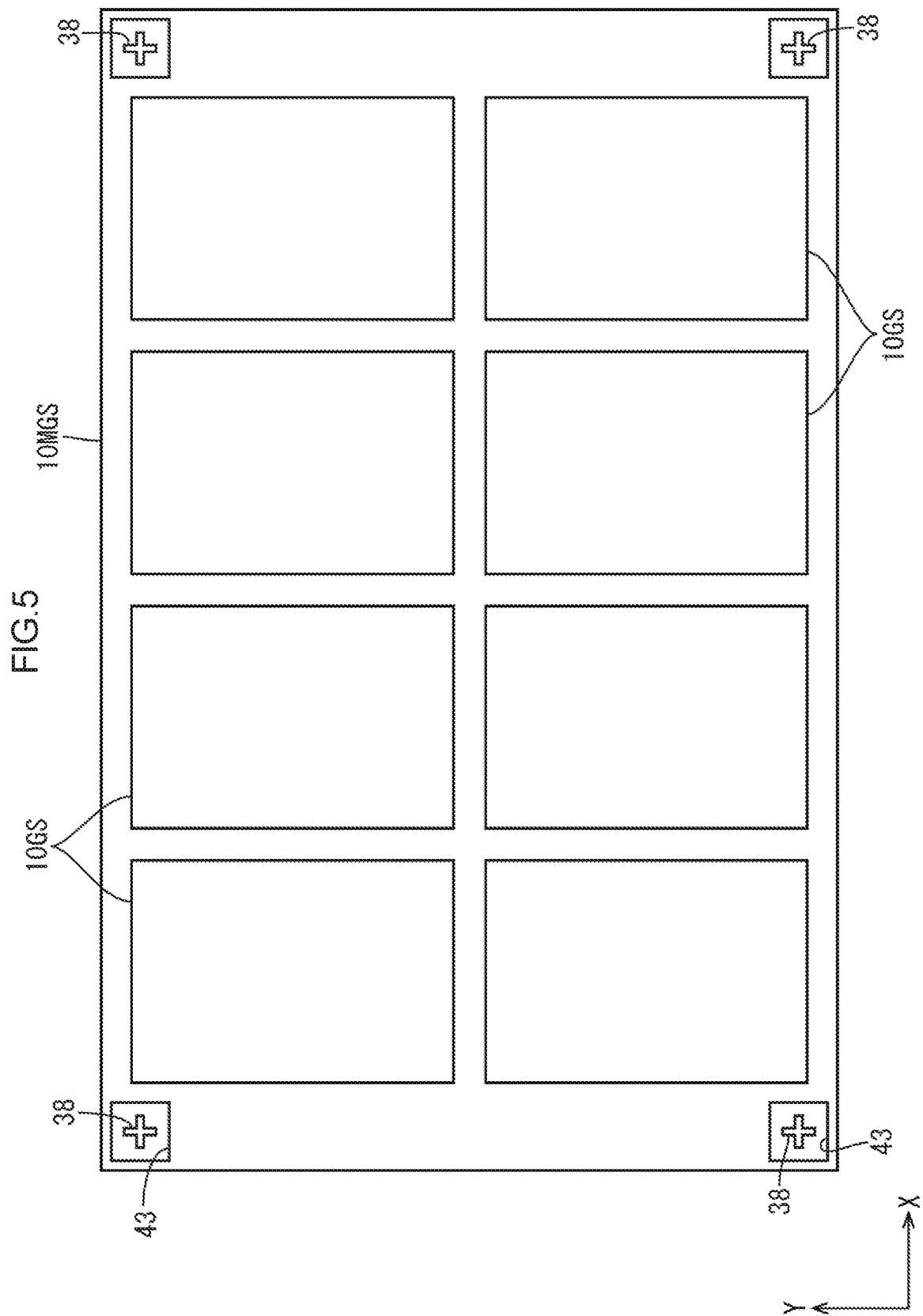
FIG. 5 is a plan view of a mother glass substrate.
Figure 6:
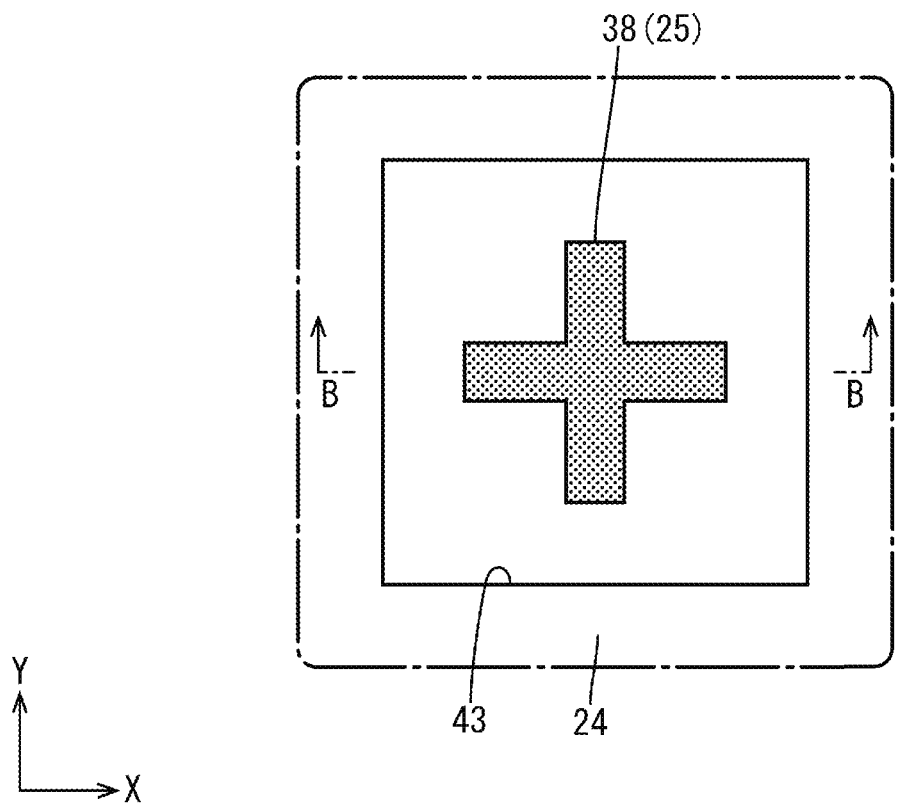
FIG. 6 is an enlarged plan view illustrating a part of the mother glass substrate near an upper layer side alignment mark.
Figure 7:
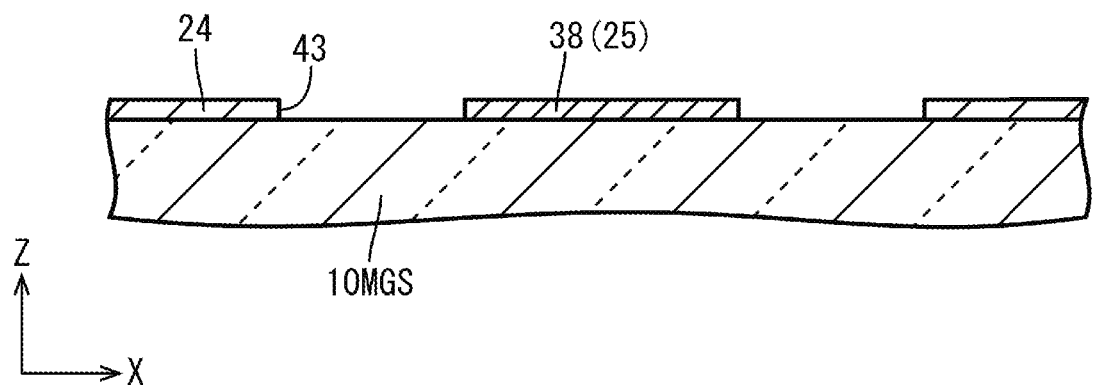
FIG. 7 is a cross-sectional view taken along line B-B in FIG. 6.

The liquid crystal panel 10 according to this embodiment has the above-described configuration and a method of producing such a liquid crystal panel will be described. The liquid crystal panel 10 of this embodiment is produced by bonding the CF substrate 10A and the array substrate 10B that are produced separately. In the embodiment section, in producing the CF substrates 10A and the array substrates 10B, a mother glass substrate (a substrate) 10MGS on which glass substrates 10GS are arranged in a plane surface thereof is processed with various kinds of producing devices, which are not illustrated, as illustrated in FIG. 5. In FIG. 5, outlines of the glass substrates 10GS are illustrated with solid lines. Upper layer side alignment marks 38 are disposed on the mother glass substrate 10MGS that is used for producing the array substrates 10B. The upper layer side alignment marks 38 are used for alignment adjustment (positioning) of the mother glass substrate 10MGS with respect to a stage (not illustrated) included in the various producing devices for supporting the mother glass substrate 10MGS thereon. The upper layer side alignment marks 38 are not overlapped with the glass substrates 10GS (that to be the array substrates 10B) and are disposed on four corner sections of the mother glass substrate 10MGS, respectively. As illustrated in FIG. 6, the upper layer side alignment mark 38 includes a section extending in the X-axis direction and a section extending in the Y-axis direction. The upper layer side alignment mark 38 has a plan view shape of a substantially cross including the above sections that are arranged perpendicular to each other (cross). As illustrated in FIG. 7, the upper layer side alignment mark 38 is formed from the second metal film 25 and directly disposed on the surface of the glass substrate 10GS. In FIG. 6, a forming area of the upper layer side alignment mark 38 that is formed from the second metal film 25 is illustrated with shading. Hereinafter, a method of producing the array substrate 10B included in the liquid crystal panel 10 will be described in detail.

The method of producing the array substrate 10B at least includes a first metal film forming process (a lower layer side metal film forming process), a first interlayer insulation film forming process (an insulation film forming process), a second metal film forming process (an upper layer side metal film forming process), a photoresist film forming process, an etching process, and a photoresist removing process. In the first metal film forming process, the first metal film (a lower layer side metal film) 23 is formed on an upper layer side of the mother glass substrate (a substrate) 10MGS and subjected to patterning. In the first interlayer insulation film forming process, the first interlayer insulation film (an insulation film) 24 is formed and subjected to patterning. In the second metal film forming process, the second metal film 25 is formed. In the photoresist film forming process, a photoresist film 41 is formed and subjected to patterning. In the etching process, the first metal film 23 and the second metal film 25 are subjected to etching with using the photoresist film 41. In the photoresist film removing process, the photoresist film 41 is removed. Each of the processes will be described in detail. The method of producing the array substrate 10B includes following processes performed after the photoresist removing process. The method further includes at least a gate insulation film forming process forming the gate insulation film 26 on an upper layer side of the second metal film 25, a semiconductor film forming process in which the semiconductor film 27 is formed and subjected to patterning, a third metal film forming process in which the third metal film 28 is formed and subjected to patterning, a flattening film forming process in which the flattening film 29 is formed and subjected to patterning, a fourth metal film forming process in which the fourth metal film 30 is formed and subjected to patterning, a second interlayer insulation film forming process in which the second interlayer insulation film 31 is formed and subjected to patterning, a first transparent electrode film forming process in which the first transparent electrode film 32 is formed and subjected to patterning, a third interlayer insulation film forming process in which the third interlayer insulation film 33 is formed and subjected to patterning, a second transparent electrode film forming process in which the second transparent electrode film 34 is formed and subjected to patterning, and an alignment film forming process in which the alignment film 20 is formed and subjected to alignment treatment.

Figure 8:
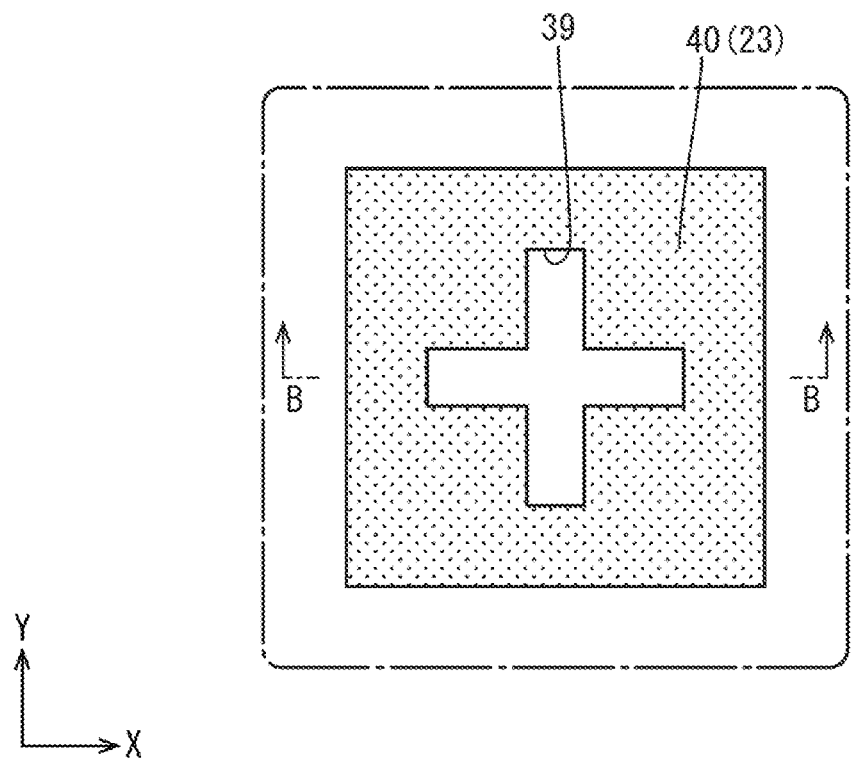
FIG. 8 is a plan view illustrating a lower layer side alignment mark base including a lower layer side alignment mark that is formed in a lower layer side metal film forming process included in the method of producing an array substrate.
Figure 9:
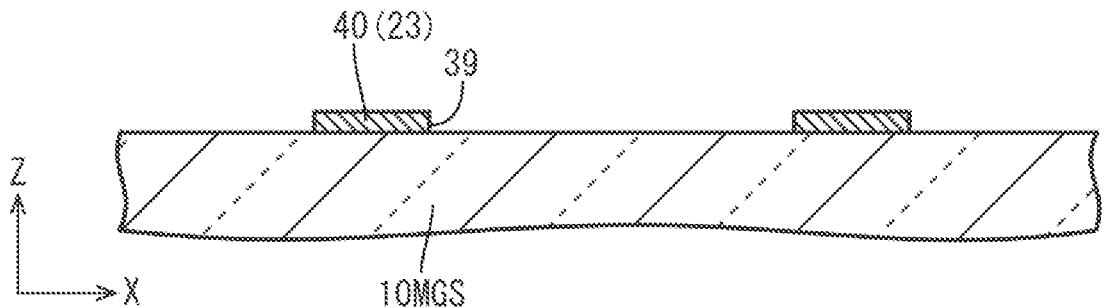
FIG. 9 is a cross-sectional view taken along line B-B in FIG. 8.

In the first metal forming process, the first metal film 23 is formed on the surface of the mother glass substrate 10MGS and the first metal film 23 is subjected to patterning with using a photomask (not illustrated) having a predetermined pattern. Then, as illustrated in FIGS. 8 and 9, a lower layer side alignment mark base 40 having a lower layer side alignment mark 39, which is a hole, is formed. As illustrated in FIG. 8, the lower layer side alignment mark 39 includes a section extending in the X-axis direction and a section extending in the Y-axis direction. The lower layer side alignment mark 39 has a plan view shape of a substantially cross including the above sections that are arranged perpendicular to each other (cross). The lower layer side alignment mark 39 is a hole that is formed in a part of the first metal film 23 and an outline of the lower layer side alignment mark 39 is defined by a hole edge in the lower layer side alignment mark base 40. The lower layer side alignment mark base 40 has a square outline and has the lower layer side alignment mark 39 of the substantially cross shape hole at a middle portion thereof. In FIG. 8, the forming area of the lower layer side alignment mark base 40 formed from the first metal film 23 illustrated with a shading (a relatively lower dot density) different from the shading of the forming area of the upper layer side alignment mark 38 illustrated in FIG. 6.

Figure 10:
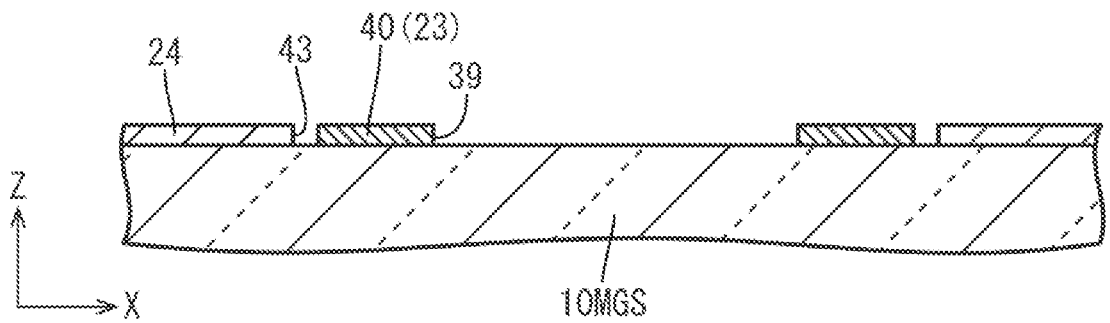
FIG. 10 is a cross-sectional view illustrating a substrate including a second metal film that is formed in an upper layer side metal film forming process included in the method of producing an array substrate.

In the first interlayer insulation film forming process, the first interlayer insulation film 24 is formed on an upper layer side with respect to the mother glass substrate 10MGS and the first metal film 23, and the first interlayer insulation film 24 is subjected to patterning using a photomask (not illustrated) having a predetermined pattern. Then, as illustrated in FIG. 10, the first interlayer insulation film 24 having an alignment mark surrounding hole 43 around the lower layer side alignment mark base 40 is formed. The alignment mark surrounding hole 43 has a square shape that is slightly greater than the outline of the lower layer side alignment mark base 40. The first interlayer insulation film 24 does not overlap the lower layer side alignment mark base 40 that is formed from the first metal film 23. In the first interlayer insulation film forming process, when the mother glass substrate 10MGS is placed on the stage of the producing device to be used, alignment adjustment of the mother glass substrate 10MGS with respect to the stage can be performed with using the lower layer side alignment mark 39. Therefore, the first interlayer insulation film 24 can be positioned accurately in performing patterning, and the alignment mark surrounding hole 43 can be formed with high accuracy.

Figure 11:
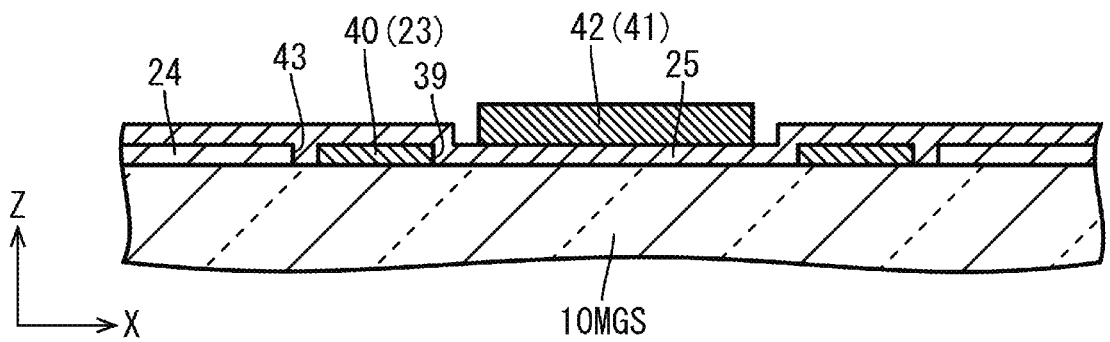
FIG. 11 is a cross-sectional view illustrating the substrate including a photoresist film formed in a photoresist film forming process included in the method of producing an array substrate and subjected to patterning.

In the second metal film forming process, the second metal film 25 is formed on the upper layer side with respect to the mother glass substrate 10MGS, the first metal film 23, and the first interlayer insulation film 24 (refer FIG. 11). In the photoresist film forming process, the photoresist film 41 is formed on an upper layer side with respect to the second metal film 25 and the first metal film 23 is subjected to patterning with using a photomask (not illustrated) of a predetermined pattern. Then, as illustrated in FIG. 11, a lower layer side alignment mark overlapping portion 42 that is formed from the photoresist film 41 is formed so as to overlap a part of the lower layer side alignment mark 39. In the photoresist film forming process, the alignment adjustment of the mother glass substrate 10MGS can be performed with using the lower layer side alignment mark 39 when the mother glass substrate 10MGS is placed on the stage of the manufacturing device. Therefore, the photoresist film 41 can be subjected to patterning with high accuracy and the lower layer side alignment mark overlapping portion 42 can be formed with high accuracy. Furthermore, in the photoresist film forming process, the lower layer side alignment mark overlapping portion 42 is slightly smaller than the lower layer side alignment mark 39. The planar shape of the lower layer side alignment mark overlapping portion 42 is substantially a cross shape that is similar to the shape of the lower layer side alignment mark 39. A space is provided between an outer edge of the lower layer side alignment mark overlapping portion 42 and an opening edge of the lower layer side alignment mark base 40 (the outline of the lower layer side alignment mark 39) over entire peripheries thereof. Namely, an entire area of the lower layer side alignment mark overlapping portion 42 does not overlap a hole edge of the lower layer side alignment mark 39. According to such a configuration, even if the lower layer side alignment mark overlapping portion 42 that is formed with patterning in the photoresist film forming process is displaced from the lower layer side alignment mark base 40, the lower layer side alignment mark base 40 is likely not to overlap the lower layer side alignment mark overlapping portion 42 that is formed from the photoresist film 41 and is smaller than the lower layer side alignment mark 39. Accordingly, the lower layer side alignment mark base 40 is surely removed over an entire area thereof in the etching process, which will be described later.

Figure 12:
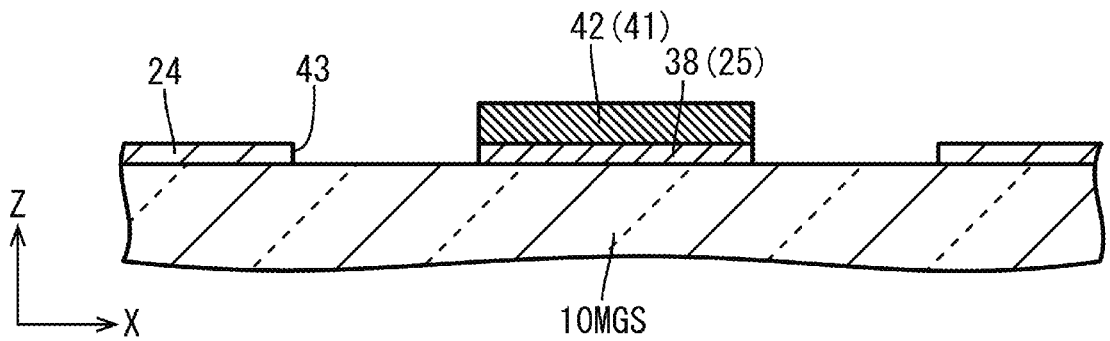
FIG. 12 is a cross-sectional view illustrating the substrate that is subjected to etching in an etching process included in the method of producing an array substrate and subjected to patterning.

As illustrated in FIG. 12, in the etching process, portions of the first metal film 23 and the second metal film 25 that do not overlap the lower layer side alignment mark overlapping portion 42, which is formed from the photoresist film 41, are selectively removed with etching. The lower layer side alignment mark base 40, which is formed from the first metal film 23, does not overlap the lower layer side alignment mark overlapping portion 42 that overlaps a part of the lower layer side alignment mark 39 (refer FIG. 11). Therefore, the lower layer side alignment mark base 40 is removed together with a part of the second metal film 25 (a portion other than the upper layer side alignment mark 38) according to the etching operation. A part of the second metal film 25 overlapping the lower layer side alignment mark overlapping portion 42 is not removed with etching and remains as the upper layer side alignment mark 38. The upper layer side alignment mark 38 overlaps a part of the lower layer side alignment mark 39, and according to such a position relation, the upper layer side alignment mark 38 is arranged in an arrangement space for the lower layer side alignment mark 39. Specifically, the upper layer side alignment mark 38 has an outline slightly smaller than that of the lower layer side alignment mark 39 and the upper layer side alignment mark 38 and the lower layer side alignment mark 39 are concentric. Therefore, compared to a configuration that the lower layer side alignment mark and the upper layer side alignment mark are arranged in separate positions, the arrangement space for each of the alignment marks 38, 39 can be smaller and alignment accuracy can be improved.

In the photoresist removing process, the photoresist film 41 is removed and the upper layer side alignment mark 38 that is formed from the second metal film 25 is uncovered as illustrated in FIGS. 6 and 7. The obtained upper layer side alignment mark 38 is arranged in the alignment mark surrounding hole 43 that is formed in the first interlayer insulation film 24. Accordingly, in each of the processes of the method of producing the array substrate 10B after the gate insulation film forming process, the alignment adjustment of the mother glass substrate 10MGS with respect to the stage of each producing device can be performed with high accuracy with using the upper layer side alignment mark 38.

As described before, the method of producing the array substrate (the substrate having an alignment mark) 10B of this embodiment includes the first metal film forming process (the lower layer side metal film forming process), the second metal film forming process (the upper layer side metal film forming process), the photoresist film forming process, the etching process, and the photoresist film removing process. In the first metal film forming process, the first metal film (the lower layer side metal film) 23 is formed on the mother glass substrate (the substrate) 10MGS and the lower layer side alignment mark base 40 having the lower layer side alignment mark 39, which is a hole, is formed with patterning. In the second metal film forming process, the second metal film (the upper layer side metal film) 25 is formed on the mother glass substrate 10MGS and the first metal film 23. In the photoresist film forming process, the photoresist film 41 is formed on the second metal film 25 and the lower layer side alignment mark overlapping portion 42 that overlaps at least a part of the lower layer side alignment mark 39 is formed with patterning. In the etching process, the portions of the first metal film 23 and the second metal film 25 that do not overlap the lower layer side alignment mark overlapping portion 42, which is the photoresist film 41, are selectively removed with etching so that the upper layer side alignment mark 38 that is formed from the second metal film 25 is formed. In the photoresist film removing process, the photoresist film 41 is removed.

In the first metal film forming process, the first metal film 23 is formed on the mother glass substrate 10MGS and subjected to pattering. Then, the lower layer side alignment mark base 40 having the lower layer side alignment mark 39, which is a hole, is formed. After the second metal film 25 is formed on the mother glass substrate 10MGS and the first metal film 23 in the second metal film forming process, the photoresist film 41 is formed on the second metal film 25 and subjected to patterning in the photoresist film forming process. Then, the lower layer side alignment mark overlapping portion 42 that overlaps at least a part of the lower layer side alignment mark 39 and is formed from the photoresist film 41 is formed. In the photoresist film forming process, the photoresist film 41 is subjected to patterning after the alignment adjustment of the mother glass substrate 10MGS is performed with using the lower layer side alignment mark 39 of the lower layer side alignment mark base 40. Therefore, the lower layer side alignment mark overlapping portion 42 can be formed with high accuracy.

In the etching process, the portions of the first metal film 23 and the second metal film 25 that do not overlap the lower layer side alignment mark overlapping portion 42, which is the photoresist film 41, are selectively removed with etching. The lower layer side alignment mark base 40, which is the first metal film 23, dose not overlap the lower layer side alignment mark overlapping portion 42 that is the photoresist film 41 and overlaps at least a part of the lower layer side alignment mark 39. Therefore, the lower layer side alignment mark base 40 is removed according to the etching treatment. The portion of the second metal film 25 overlapping the lower layer side alignment mark overlapping portion 42, which is the photoresist film 41, is not removed with etching and remains as the upper layer side alignment mark 38. The upper layer side alignment mark 38 overlaps at least a part of the lower layer side alignment mark 39 and therefore, the upper layer side alignment mark 38 is arranged in the arrangement space for the lower layer side alignment mark 39. Therefore, compared to a configuration that the lower layer side alignment mark and the upper layer side alignment mark are arranged in separate positions, the arrangement space for each of the alignment marks 38, 39 can be smaller and alignment accuracy can be improved. Thereafter, in the photoresist film removing process, the photoresist film 41 is removed. Accordingly, the alignment adjustment of the mother glass substrate 10MGS can be performed with using the upper layer side alignment mark 38.

In the photoresist film forming process, the lower layer side alignment mark overlapping portion 42 is formed to be slightly smaller than the lower layer side alignment mark 39. Accordingly, even if the lower layer side alignment mark overlapping portion 42 that is formed from the photoresist film 41 with patterning in the photoresist film forming process is displaced from the lower layer side alignment mark base 40, which is the first metal film 23, the lower layer side alignment mark base 40 is likely not to overlap the lower layer side alignment mark overlapping portion 42 that is formed from the photoresist film 41 and smaller than the lower layer side alignment mark 39. Accordingly, the lower layer side alignment mark base 40 is surely removed over an entire area thereof in the etching process.

Second Embodiment

A second embodiment will be described with reference to FIGS. 13 to 19. In the second embodiment section, a method of producing an array substrate is altered from that in the first embodiment. Similar configurations, operations, and effects to the first embodiment will not be described.

The method of producing the array substrate according to this embodiment includes a first metal film forming process, a photoresist film forming process, and an etching process that differ from those of the first embodiment. In the following, the first metal film forming process, the photoresist film forming process, and the etching process will be mainly described in detail.

Figure 13:
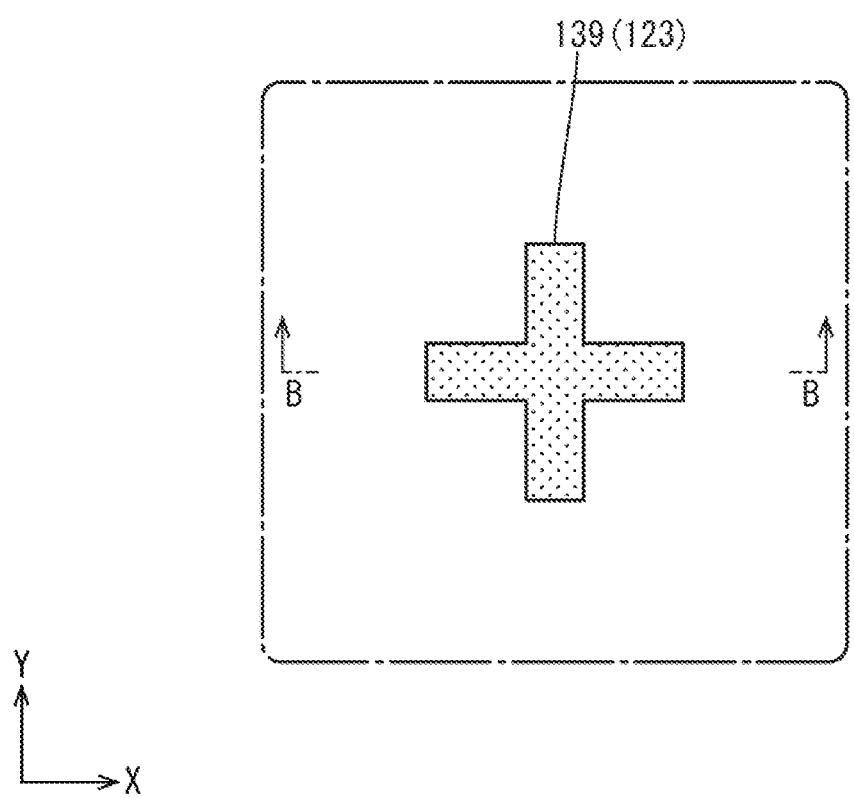
FIG. 13 is a plan view illustrating a substrate having a lower layer side alignment mark that is formed in a lower layer side metal film process included in the method of producing an array substrate according to a second embodiment of the present technology.
Figure 14:
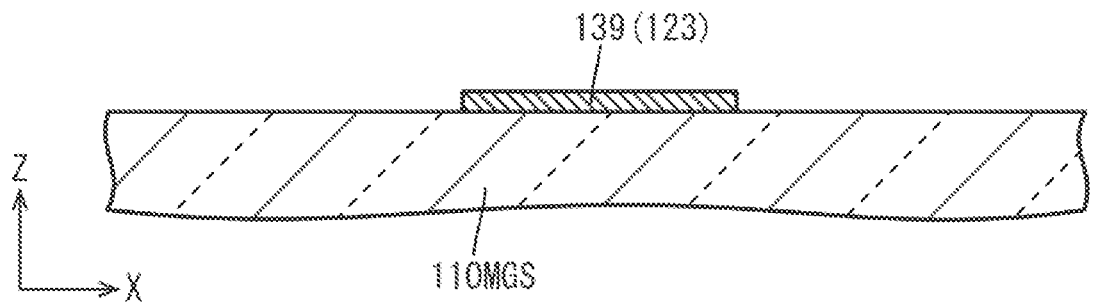
FIG. 14 is a cross-sectional view taken along line B-B in FIG. 13.
Figure 15:
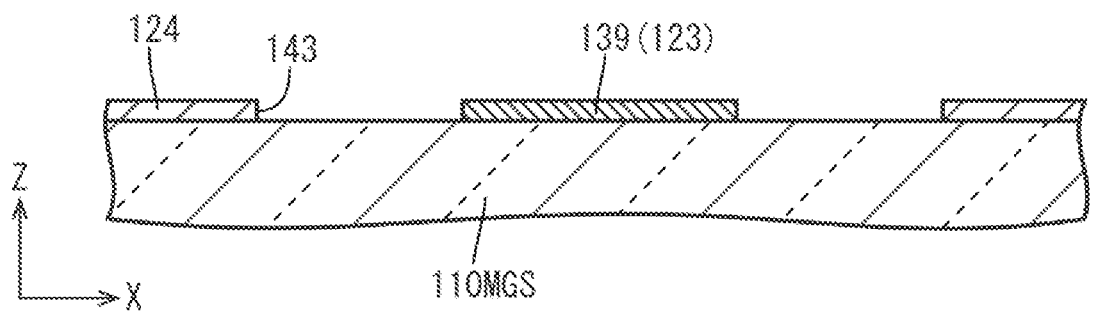
FIG. 15 is a cross-sectional view illustrating a substrate including a second metal film that is formed in an upper layer side metal film forming process included in the method of producing an array substrate.

In the first metal forming process, a first metal film 123 is formed on a mother glass substrate 110MGS and the first metal film 123 is subjected to patterning with using a photomask (not illustrated) having a predetermined pattern. Then, as illustrated in FIGS. 13 and 14, a lower layer side alignment mark 139 that is formed from the first metal film 123 and has a substantially cross plan view shape is formed. A specific shape of the lower layer side alignment mark 139 is similar to that of the upper layer side alignment mark 38 (refer FIG. 6) described in the first embodiment section. Then, the first interlayer insulation film forming process is performed so that an alignment mark surrounding hole 143 surrounding the lower layer side alignment mark 139 is formed as illustrated in FIG. 15. Thereafter, a second metal film 125 is formed on the mother glass substrate 110MGS, the first metal film 123, and a first interlayer insulation film 124 in the second metal film forming process (refer FIG. 16).

Figure 16:
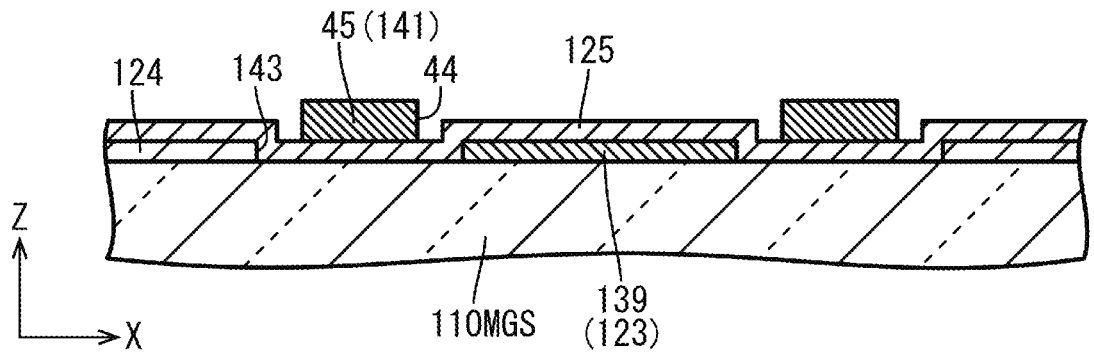
FIG. 16 is a cross-sectional view illustrating the substrate including a photoresist film that is formed in a photoresist film forming process included in the method of producing an array substrate and subjected to patterning.

In the photoresist film forming process, a photoresist film 141 is formed on the second metal film 125 and the first interlayer insulation film 124 is subjected to patterning with using a photomask (not illustrated) having a predetermined pattern. Then, as illustrated in FIG. 16, a lower layer side alignment mark non-overlapping portion 45 that is formed from the photoresist film 141 and does not overlap the lower layer side alignment mark 139 is formed. The lower layer side alignment mark non-overlapping portion 45 has a lower layer side alignment mark overlapping hole 44 through which the lower layer side alignment mark 139 is exposed. Namely, the lower layer side alignment mark non-overlapping portion 45 has a frame shape having a cross-shaped plan view outline and extending along an outline of the lower layer side alignment mark 139. In the photoresist film forming process, the alignment adjustment of the mother glass substrate 110MGS is performed with using the lower layer side alignment mark 139 when the mother glass substrate 110MGS is placed on the stage of a producing device to be used. Therefore, positioning accuracy is improved when the photoresist film 141 is subjected to patterning and the lower layer side alignment mark non-overlapping portion 45 can be formed with high accuracy. Furthermore, in the photoresist film forming process, the lower layer side alignment mark non-overlapping portion 45 is formed such that the lower layer side alignment mark overlapping hole 44 is slightly greater than the lower layer side alignment mark 139. The lower layer side alignment mark non-overlapping portion 45 has a plan view shape of substantially a cross that is similar to that of the lower layer side alignment mark 139. A space is provided between an hole edge of the lower layer side alignment mark non-overlapping portion 45 (an inner peripheral edge of the lower layer side alignment mark overlapping hole 44) and an outer peripheral edge of the lower layer side alignment mark 139 over entire peripheries thereof. Namely, the lower layer side alignment mark non-overlapping portion 45 does not overlap the lower layer side alignment mark 139 over an entire area thereof. According to such a configuration, even if the lower layer side alignment mark non-overlapping portion 45 that is formed with patterning in the photoresist film forming process is displaced from the lower layer side alignment mark 139, the lower layer side alignment mark 139 is likely not to overlap the lower layer side alignment mark overlapping hole 44 that is slightly greater than lower layer side alignment mark 139. Accordingly, the lower layer side alignment mark 139 is surely removed over an entire area thereof in the etching process.

Figure 17:
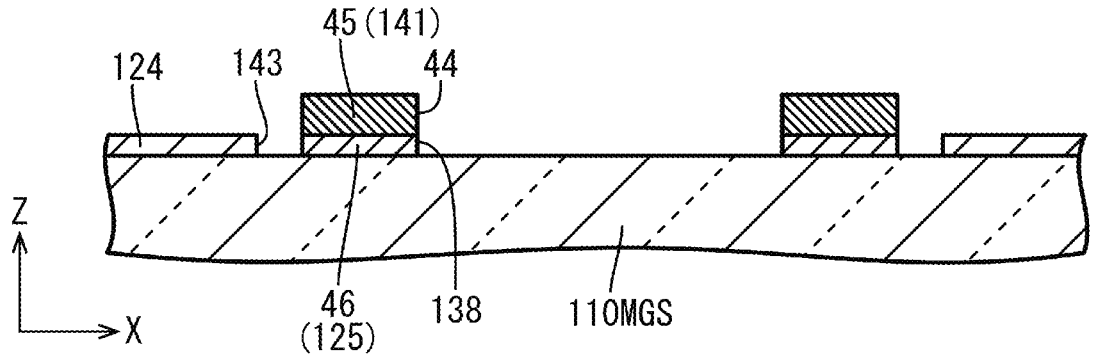
FIG. 17 is across sectional view illustrating the substrate that is subjected to etching in an etching process included in the method of producing an array substrate.
Figure 18:
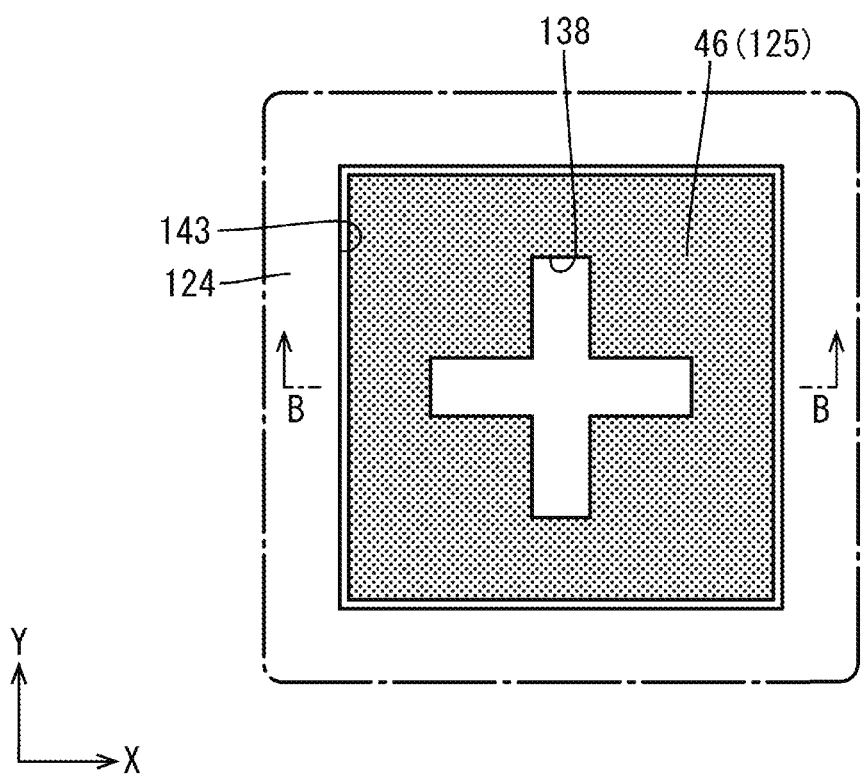
FIG. 18 is an enlarged plan view illustrating a part of the mother glass substrate near the upper layer side alignment mark after the photoresist removing process included in the method of producing an array substrate.
Figure 19:
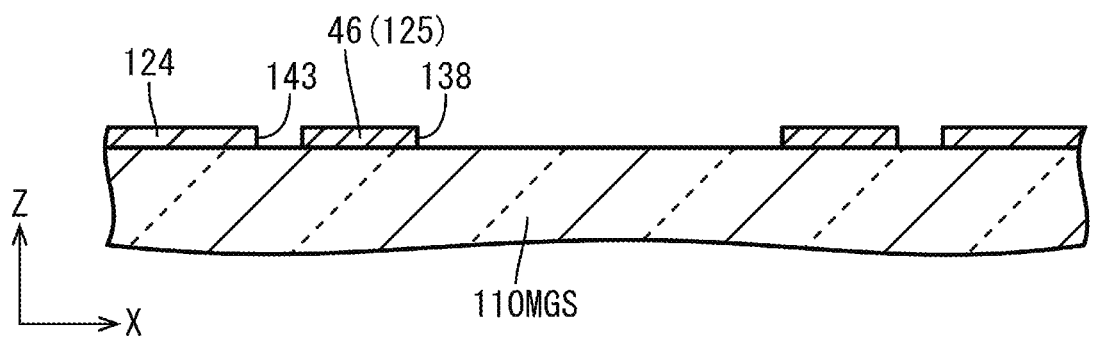
FIG. 19 is a cross-sectional view taken along line B-B in FIG. 18.

In the etching process, portions of the first metal film 123 and the second metal film 125 that do not overlap the lower layer side alignment mark non-overlapping portion 45, which is formed from the photoresist film 141, are selectively removed with etching. The lower layer side alignment mark 139, which is formed from the first metal film 123, does not overlap the lower layer side alignment mark non-overlapping portion 45 that is formed from the photoresist film 141 and includes the lower layer side alignment mark overlapping hole 44 (refer FIG. 16). The lower layer side alignment mark 139 is exposed through the lower layer side alignment mark overlapping hole 44. Therefore, the lower layer side alignment mark 139 is removed together with a part of the second metal film 125 (a portion other than an upper layer side alignment mark base 46) according to the etching operation. A part of the second metal film 125 overlapping the lower layer side alignment mark non-overlapping portion 45 is not removed with etching and remains as the upper layer side alignment mark base 46. As illustrated in FIG. 17, the upper layer side alignment mark base 46 includes an upper layer side alignment mark 138 that is a hole and overlaps the lower layer side alignment mark overlapping hole 44 (refer FIGS. 18 and 19). The upper layer side alignment mark 138 is formed by forming a hole in a part of the second metal film 125 and an outline of the upper layer side alignment mark 138 is defined by a hole edge in the upper layer side alignment mark base 46. As illustrated in FIG. 18, the upper layer side alignment mark base 46 has a square outline and has the upper layer side alignment mark 138 of a substantially cross shaped hole at a middle portion thereof. According to the configuration that the upper layer side alignment mark 138 overlaps the lower layer side alignment mark 139, the upper layer side alignment mark 138 is arranged in an arrangement space for the lower layer side alignment mark 139. Specifically, the upper layer side alignment mark 138 has an outline slightly smaller than that of the lower layer side alignment mark 139 and the upper layer side alignment mark 138 and the lower layer side alignment mark 139 are concentric. Therefore, compared to a configuration that the lower layer side alignment mark and the upper layer side alignment mark are arranged in separate positions, the arrangement space for each of the alignment marks 138, 139 can be smaller and alignment accuracy can be improved. In the photoresist removing process, the photoresist film 141 is removed so that the upper layer side alignment mark base 46, which is formed from the second metal film 125, is exposed as illustrated in FIGS. 18 and 19.

As described before, the method of producing the array substrate of this embodiment includes the first metal film forming process, the second metal film forming process, the photoresist film forming process, the etching process, and the photoresist film removing process. In the first metal film forming process, the first metal film 123 is formed on the mother glass substrate 110MGS and the lower layer side alignment mark 139 is formed with patterning. In the second metal film forming process, the second metal film 125 is formed on the mother glass substrate 110MGS and the first metal film 123. In the photoresist film forming process, the photoresist film 141 is formed on the second metal film 125 and the lower layer side alignment mark non-overlapping portion 45 with patterning. The lower layer side alignment mark non-overlapping portion 45 has the lower layer side alignment mark overlapping hole 44 overlapping the lower layer side alignment mark 139 and does not overlap the lower layer side alignment mark 139. In the etching process, the portions of the first metal film 123 and the second metal film 125 that do not overlap the lower layer side alignment mark non-overlapping portion 45, which is the photoresist film 141, are selectively removed with etching so that the upper layer side alignment mark base 46 that is formed from the second metal film 125 is formed. The upper layer side alignment mark base 46 includes the upper layer side alignment mark 138 that is a hole overlapping the lower layer side alignment mark overlapping hole 44. In the photoresist film removing process, the photoresist film 141 is removed.

In the first metal film forming process, the first metal film 123 is formed on the mother glass substrate 110MGS and subjected to pattering. Then, the lower layer side alignment mark 139 is formed. After the second metal film 125 is formed on the mother glass substrate 110MGS and the first metal film 123 in the second metal film forming process, the photoresist film 141 is formed on the second metal film 125 and subjected to patterning in the photoresist film forming process. Then, the lower layer side alignment mark non-overlapping portion 45 that is formed from the photoresist film 141 and includes the lower layer side alignment mark overlapping hole 44 overlapping the lower layer side alignment mark 139 and does not overlap the lower layer side alignment mark 139 is formed. In the photoresist film forming process, the photoresist film 141 is subjected to patterning after the alignment adjustment of the mother glass substrate 110MGS is performed with using the lower layer side alignment mark 139. Therefore, the lower layer side alignment mark non-overlapping portion 45 can be formed with high accuracy.

In the etching process, the portions of the first metal film 123 and the second metal film 125 that do not overlap the lower layer side alignment mark non-overlapping portion 45, which is the photoresist film 141, are selectively removed with etching. The lower layer side alignment mark 139, which is the first metal film 123, dose not overlap the lower layer side alignment mark non-overlapping portion 45 that is the photoresist film 141 and has the lower layer side alignment mark overlapping hole 44 overlapping the lower layer side alignment mark 139. Therefore, the lower layer side alignment mark 139 is removed according to the etching treatment. The portion of the second metal film 125 overlapping the lower layer side alignment mark non-overlapping portion 45, which is the photoresist film 141, is not removed with etching and remains as the upper layer side alignment mark base 46. The upper layer side alignment mark base 46 has the upper layer side alignment mark 138 that is a hole overlapping the lower layer side alignment mark overlapping hole 44. The upper layer side alignment mark 38 overlaps the lower layer side alignment mark 139 and therefore, the upper layer side alignment mark 138 is arranged in the arrangement space for the lower layer side alignment mark 139. Therefore, compared to a configuration that the lower layer side alignment mark and the upper layer side alignment mark are arranged in separate positions, the arrangement space for each of the alignment marks 138, 139 can be smaller and alignment accuracy can be improved. Thereafter, in the photoresist film removing process, the photoresist film 141 is removed. Accordingly, the alignment adjustment of the mother glass substrate 110MGS can be performed with using the upper layer side alignment mark 138.

In the photoresist film forming process, the lower layer side alignment mark non-overlapping portion 45 is formed such that the lower layer side alignment mark overlapping hole 44 is slightly greater than the lower layer side alignment mark 139. Accordingly, even if the lower layer side alignment mark non-overlapping portion 45 that is formed from the photoresist film 141 with patterning in the photoresist film forming process is displaced from the lower layer side alignment mark 139, which is the first metal film 123, the lower layer side alignment mark 139 is likely not to overlap a hole edge of the lower layer side alignment mark overlapping hole 44 that is slightly greater than the lower layer side alignment mark 139. Accordingly, the lower layer side alignment mark 139 is surely removed over an entire area thereof in the etching process.

Other Embodiments

The present technology is not limited to the embodiment described above with reference to the drawings and the following embodiments may be included in the technical filed of the present technology.

(1) In each of the above embodiments, the upper layer side alignment mark and the upper layer side alignment mark base are formed from the second metal film. However, the upper layer side alignment mark and the upper layer side alignment mark base may be formed from the third metal film or the fourth metal film. In such a configuration, the lower layer side alignment mark and the lower layer side alignment mark base may be formed from any one of the first metal film, the second metal film, and the third metal film.

(2) In each of the above embodiments, the lower layer side alignment mark and the lower layer side alignment mark base are formed from the first metal. However, the lower layer side alignment mark and the lower layer side alignment mark base may be formed from the second metal film or the third metal film. In such a configuration, the upper layer side alignment mark and the upper layer side alignment mark base may be formed from the third metal film or the fourth metal film.

(3) In each of the above embodiments, the touch line lead-out wires are formed from the first metal film. However, the touch line lead-out wires may be formed from the second metal film or the third metal film. In such a configuration, the first metal film may not be included and accordingly, the lower layer side alignment mark and the lower layer side alignment mark base may be formed from the second metal film or the third metal film like the configuration of (2).

(4) Other than each of the above embodiments, the fourth metal film may not be included. In such a configuration, the touch line lead-out wires may be formed from the third metal film similar to the source lines.

(5) In the first embodiment, the lower layer side alignment mark overlapping portion overlaps a part of the lower layer side alignment mark. However, the lower layer side alignment mark overlapping portion may overlap an entire area of the lower layer side alignment mark.

(6) In the second embodiment, the lower layer side alignment mark overlaps a part of the lower layer side alignment mark overlapping hole of the lower layer side alignment mark non-overlapping portion in the photoresist film forming process. However, the lower layer side alignment mark may overlap an entire area of the lower layer side alignment mark overlapping hole.

(7) Other than the above embodiments, a specific plan-view shape of each alignment mark may be altered appropriately.

(8) In each of the above embodiments, the upper layer side alignment marks are arranged at the four corners of the mother glass substrate. However, the specific arrangement of the upper layer side alignment marks on the mother glass substrate may be altered appropriately. The specific number of the upper layer side alignment marks on the mother glass substrate may be altered appropriately.

(9) Other than the above embodiments, the specific number or the specific arrangement of the glass substrates included in the mother glass substrate may be altered appropriately.

(10) In each of the above embodiments, the touch panel pattern is a self-capacitance touch panel pattern. However, the touch panel pattern may be a mutual capacitance type. A part of or all of the touch panel pattern may be disposed on the CF substrate. The liquid crystal panel may not include the touch panel pattern.

(11) In each of the above embodiments, the driver is mounted on the array substrate of the liquid crystal panel with the chip on glass (COG) mounting technology. However, the driver may be mounted on the flexible printed circuit board with the chip on film (COF) mounting technology.

(12) Each of the above embodiments includes a transmissive type liquid crystal panel. However, the present technology may be applied to a reflection type liquid crystal panel or a semi-reflection type liquid crystal panel.

(13) In each of the above embodiments, the liquid crystal panel has a vertically elongated rectangular plan view shape. However, the liquid crystal panel has a plan view shape of a horizontally elongated rectangular shape, a square, a circle, a semi-circle, an oval shape, an ellipse, or a trapezoid.

The invention claimed is:

1. A method of producing a substrate including an alignment mark comprising:
   a lower layer side metal film forming process of forming a lower layer side metal film on a substrate and forming a lower layer side alignment mark base having a lower layer side alignment mark that is a hole;
   an upper layer side metal film forming process of forming an upper layer side metal film on the substrate and the lower layer side metal film;
   a photoresist film forming process of forming a photoresist film with patterning on the upper layer side metal film and forming a lower layer side alignment mark overlapping portion that overlaps at least a portion of the lower layer side alignment mark;

an etching process of removing with etching selectively all portions of the lower layer side metal film and the upper layer side metal film not overlapping the lower layer side alignment mark overlapping portion, removing the lower layer side alignment mark base, and forming an upper layer side alignment mark that is formed from the upper layer side metal film; and a photoresist removing process of removing the photoresist film.

2. The method of producing a substrate having an alignment mark according to claim 1, wherein in the photoresist film forming process, the lower layer side alignment mark overlapping portion is formed to be slightly smaller than the lower layer side alignment mark.

3. A method of producing a substrate including an alignment mark comprising:

a lower layer side metal film forming process of forming a lower layer side metal film on a substrate and forming a lower layer side alignment mark;

an upper layer side metal film forming process of forming an upper layer side metal film on the substrate and the lower layer side metal film;

a photoresist film forming process of forming a photoresist film on the upper layer side metal film and forming a lower layer side alignment mark non-overlapping portion with patterning, the lower layer side alignment mark non-overlapping portion not overlapping the lower layer side alignment mark and having a lower layer side alignment mark overlapping hole overlapping the lower layer side alignment mark;

an etching process of removing with etching selectively all portions of the lower layer side metal film and the upper layer side metal film not overlapping the lower layer side alignment mark non-overlapping portion that is the photoresist film, removing the lower layer side alignment mark, and forming an upper layer side alignment mark base that is formed from the upper layer side metal film, the upper layer side alignment mark base including an upper layer side alignment mark that is a hole overlapping the lower layer side alignment mark overlapping hole; and a photoresist removing process of removing the photoresist film.

4. The method of producing a substrate having an alignment mark according to claim 3, wherein in the photoresist film forming process, the lower layer side alignment mark non-overlapping portion is formed such that the lower layer side alignment mark overlapping hole is slightly greater than the lower layer side alignment mark.

* * * * *